United States Patent
Peterson

(10) Patent No.: US 6,381,162 B1
(45) Date of Patent: Apr. 30, 2002

(54) CIRCUITRY AND METHOD FOR CONTROLLING CURRENT SURGE ON RAILS OF PARALLEL-PULLDOWN-MATCH-DETECT-TYPE CONTENT ADDRESSABLE MEMORY ARRAYS

(75) Inventor: Luverne Peterson, San Diego, CA (US)

(73) Assignee: Tality, L.P., San Jose, CA (US)

( * ) Notice: Subject to any disclaimer, the term of this patent is extended or adjusted under 35 U.S.C. 154(b) by 0 days.

(21) Appl. No.: 09/811,809

(22) Filed: Mar. 19, 2001

(51) Int. Cl.[7] ............................................. G11C 15/01
(52) U.S. Cl. ................ 365/49; 365/189.07; 365/189.11
(58) Field of Search ............................. 365/49, 189.07, 365/189.11, 203, 204, 189.02

(56) References Cited

U.S. PATENT DOCUMENTS 6,288,922 B1 * 9/2001 Wong et al. ................... 365/49

* cited by examiner

Primary Examiner—David Nelms
Assistant Examiner—David Lam
(74) Attorney, Agent, or Firm—Steven K. Barton

(57) ABSTRACT

A content addressable memory system has an array of CAM cells. Each row of the array has a match line coupled to a match line pull device. The match line pull devices of each cell are also coupled to a row return line that may be shared with an adjacent row. Each row return line is coupled through a resistive device to a rail. The CAM cells also have a data memory element and comparison logic for comparing query data against the data memory element and controlling the match line pull devices.

17 Claims, 2 Drawing Sheets

CIRCUITRY AND METHOD FOR CONTROLLING CURRENT SURGE ON RAILS OF PARALLEL-PULLDOWN-MATCH-DETECT-TYPE CONTENT ADDRESSABLE MEMORY ARRAYS

FIELD OF THE INVENTION

The Invention relates to the field of digital integrated circuits, and in particular relates to the design of CMOS Content-Addressable Memory (CAM) arrays. CAM arrays are a form of associative memory. In particular, the invention relates to circuitry for controlling current surge related to discharge of match detect lines in CAM arrays having parallel-pulldown match detect lines.

BACKGROUND OF THE INVENTION

CMOS CAM arrays are commonly used in cache systems, and other address translation systems, of high speed computing systems. They are also useful in high-speed network routers, and many other applications known in the art of computing.

CAM arrays are characterized by circuitry capable of generating a "match" output indicating whether any location of the array contains a data pattern matching a query input, and the identity of that location. CAM arrays typically are comprised of multiple rows, each row having multiple cells. Each cell of the array typically has the ability to store a unit of data, and the ability to compare that unit of data with a unit of a query input. Compare result indications of cells of each row are combined to produce a "match" signal for the row. Match signals from each row of the multiple rows together constitute the match output of the array; these signals may be encoded or used to select data from rows of additional memory.

Cells of a row typically are also connected to a common write line. The common write line allows enabling of simultaneous data writing to each cell of the row from a set of data input, or data input-output, lines.

Each cell of a CAM array is located within a column of cells of the array. Cells of a column are connected to a common unit of the query input, and are typically also connected to a common set of data input lines for writing data to cells of the array. Writing of a cell of the array typically requires that the data input lines for the cell's column be driven to a desired data value while the write line for the cell's row is activated. The data input lines may or may not be common with the query input lines of a cell depending upon the cell design used.

The unit of data stored in a CAM array is often binary, having two possible content states: logic one, and logic zero. Cells of these arrays produce a match compare result if the query input is equal to the data stored in the cell, and a mismatch result otherwise. CAM arrays are known that can store three or more states: logic one, logic zero, and don't care. Cells of these "ternary CAM" arrays produce a match compare result if the query input is either equal to the data stored in the cell, or the cell contains a don't care state, and a mismatch result otherwise.

Ternary CAM arrays are particularly useful in address translation systems that allow variably sized allocation units. Ternary CAM arrays are also useful for storing routing tables of network routers and switches.

CAM cells may store their data in either dynamic or static storage cells as known in the art of memory circuitry. Static storage offers the advantage that refresh circuitry is not required, and the advantage that true and complement signals may be drawn from each storage cell. Ternary Static CMOS CAM cells are known, including those illustrated in U.S. Pat. No. 6,044,005, that utilize a pair of six-transistor CMOS static RAM cells as memory elements for storing a mask bit and a data bit.

It is known that combining compare results of multiple cells of a row can be done in several ways. FIG. 1 (labeled "prior art") of U.S. Pat. No. 6,044,005 illustrates a parallel pulldown configuration, wherein match line ML, connected to all cells of a row, is driven low by device T4 of any cell having a mismatch compare condition. With the parallel pulldown configuration, a match for a row occurs whenever no cell of the row is driving match line ML low. FIG. 6B of U.S. Pat. No. 6,044,005 illustrates a series-string configuration, wherein transmission device T6 couples match line ripple-input ML0 to match line ripple-output ML1 when a match compare condition occurs. The match line ripple-output of each cell (except for the last cell of the row) is connected to the match line ripple-input of a following cell of the row. With this series-string configuration, a match for a row occurs when all cells couple ripple-input to ripple-output. FIG. 8 of U.S. Pat. No. 6,175,514 illustrates a full-complimentary-combiner-gate configuration, wherein compare result signals from each cell are combined by full-complimentary CMOS NAND and NOR gates to generate a row match signal.

The full-complimentary-combiner-gate configuration is fast, but can consume more room on an integrated circuit than may be desirable. The series-string configuration can be slower than desirable. The parallel pulldown configuration can produce mismatch results quickly.

The Surge Current Problem

It is known that discharge of a CMOS signal line requires that a current flow in devices attached to the line. This current is proportional to the capacitance of the signal line, to the voltage swing of the line, and inversely proportional to the time in which the discharge takes place. For example, for a signal line having capacitance C, voltage swing of V, switching in time T, the average current required for the line to discharge is $C*V/T$. For a hypothetical line having one picofarad of capacitance, switching two volts in one nanosecond, this per-line discharge current is about two milliamperes.

When a CAM array having a match detect circuit of the parallel pulldown type is designed, each cell of the array typically has a pulldown device capable of sinking the entire current necessary to discharge the match detect line under worst case process, voltage, and temperature conditions. CMOS device characteristics vary significantly with process, operating voltage, and temperature. If design margins are wide, a device designed to provide worst case per-line average discharge current of two milliamperes may provide a peak best-case, single-pulldown, discharge current of five to more than ten milliamperes.

The peak discharge current produced by a given line is also a function of how many parallel pulldown devices are active at any particular cycle. In a typical array, the average line will have more than one active pulldown at any one time. These lines may have substantially greater peak discharge current than the single-pulldown case.

Content addressable memory (CAM) arrays having more than five hundred lines are known. The peak current injected into the ground bus can be expected to be proportional to the number of lines times the peak current of each line. Peak ground bus currents of many amps can occur in such arrays.

High peak ground bus currents within an integrated circuit can cause undesirable side effects. For example, high peak currents may cause voltage spikes when flowing through ground metalization resistance; these spikes may cause signals to be misinterpreted by other logic on the chips.

Voltage spikes can also couple into, and disrupt, any analog circuitry on the same integrated circuit. Modern integrated circuits frequently combine such analog circuitry as phase locked loops, delay locked loops, analog-to-digital converters, digital-to-analog converters, and switched-capacitor filters with digital logic; it is particularly necessary that voltage spikes be prevented on these mixed-signal designs.

It is therefore desirable to minimize these peak ground bus currents.

Similarly, should a complementary version be built having P-type parallel pullups in place of the pulldown devices, it is desirable to minimize peak power-bus currents.

Solution to the Problem

A CMOS CAM array has been designed that uses parallel pulldown cell architecture. The array uses a ternary, static, cell however other embodiments may use binary or dynamic cells. Each row of the array has a ground-return line and a match line, the ground-return line being separate from that of other rows of the array.

The ground-return lines of each row are connected to the parallel pulldown devices of each cell of the row. The ground-return lines of each row also connect to several other devices in each cell, such as ground connections of the static memory elements of the cells, such that the ground-return line capacitance is greater than the match line capacitance.

The row ground-return lines couple to chip ground through a resistive device, which may be an N-type MOS transistor or may be a resistor. Chip ground is routed through the array and connected to the P-wells or substrate connections, the chip ground therefore has significant capacitance to the row ground-return lines.

Operation of the parallel pulldown devices causes most match lines to be pulled down to the ground-return line for the same row. The ground-return lines charge-share with the match line capacitance, quickly producing a voltage low enough to be detected as logic zero for the row. Charge from the ground-return lines then dissipates through the resistive devices into the chip ground, thereby spreading out the discharge to chip ground over time and reducing peak discharge current.

An alternative embodiment utilizes a ground-return line that is common to two rows. This permits use of a common layout technique wherein alternate rows of memory cells are mirrored such that adjacent cells may share common power and ground lines, and minimize the need for well spacings in the array.

DETAILED DESCRIPTION OF THE EMBODIMENTS

Figure 1:
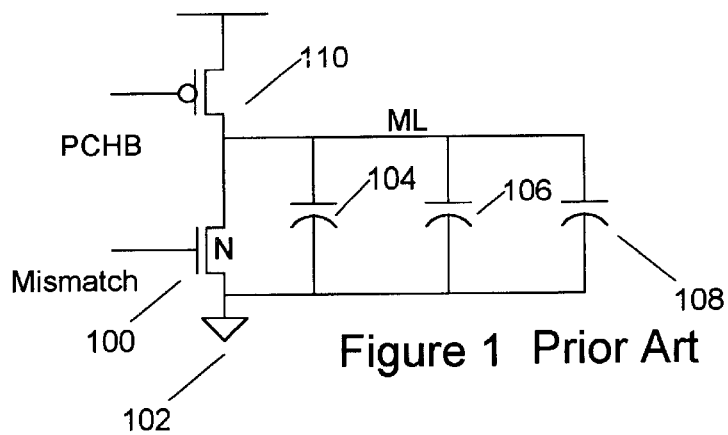
FIG. 1 is a schematic of an equivalent circuit of an array section, illustrating the surge current problem.

An equivalent circuit to a typical parallel pulldown match line ML (FIG. 1) as known in the art has a pulldown device 100, driven by a Mismatch node of at least one cell. Pulldown device 100 may represent many parallel devices, and when active, couples the match line ML to ground 102. Match line ML has some significant, distributed, capacitance to ground 102, representing device junction capacitance 104, capacitance to adjacent interconnect 106, and other parasitic capacitances 108, including parasitic capacitances of inactive pulldown devices in other cells of the same match line ML.

In operation a precharge device 110 places a charge on the match line ML, charging the capacitances 104, 106, and 108. One or more cells of match lines of several rows then discharge these capacitances to ground 102. As discussed above, the total discharge current can be quite large when multiple pulldown devices of multiple match lines discharge simultaneously.

A CAM cell embodying the present invention (FIG. 2) has a match line ML typically coupled to two or more cells. Each cell also has a static memory element 200 for storing a data bit and a static memory element 202 for storing a mask bit, these memory elements are of the six transistor static type as known in the art. Alternatively, the cell may use memory elements of the four transistor plus two resistor "poly load" type known in the art. The cell also has compare circuitry for comparing the data bit against compare inputs and for driving the match line.

The compare circuitry includes a mask transistor 204, having an output of mask bit memory element 202 driving its gate, in series with a mismatch pulldown transistor 206. The gate of mismatch pulldown transistor 206 is driven by a mismatch node 207. Mismatch node 207 has a pre-discharge transistor 208 controlled by pre-discharged cell input CBDIS and first 210 and second 212 compare transistors. First compare transistor 210 has a gate driven by true compare data input CB, and source driven by a complement data output of data bit memory element 200. Second compare transistor 212 has a gate driven by complement compare data input CBB, and source driven by a true data output of data bit memory cell 200.

Mismatch pulldown transistor 206, together with some other ground points of the cell such as but not limited to pre-discharge transistor 208, couple directly or indirectly (for example, mismatch pulldown transistor 206 couples through mask transistor 204) to a row ground RG. A separate chip ground connection connects to the substrate or P-Well connections of the array.

Figure 2:
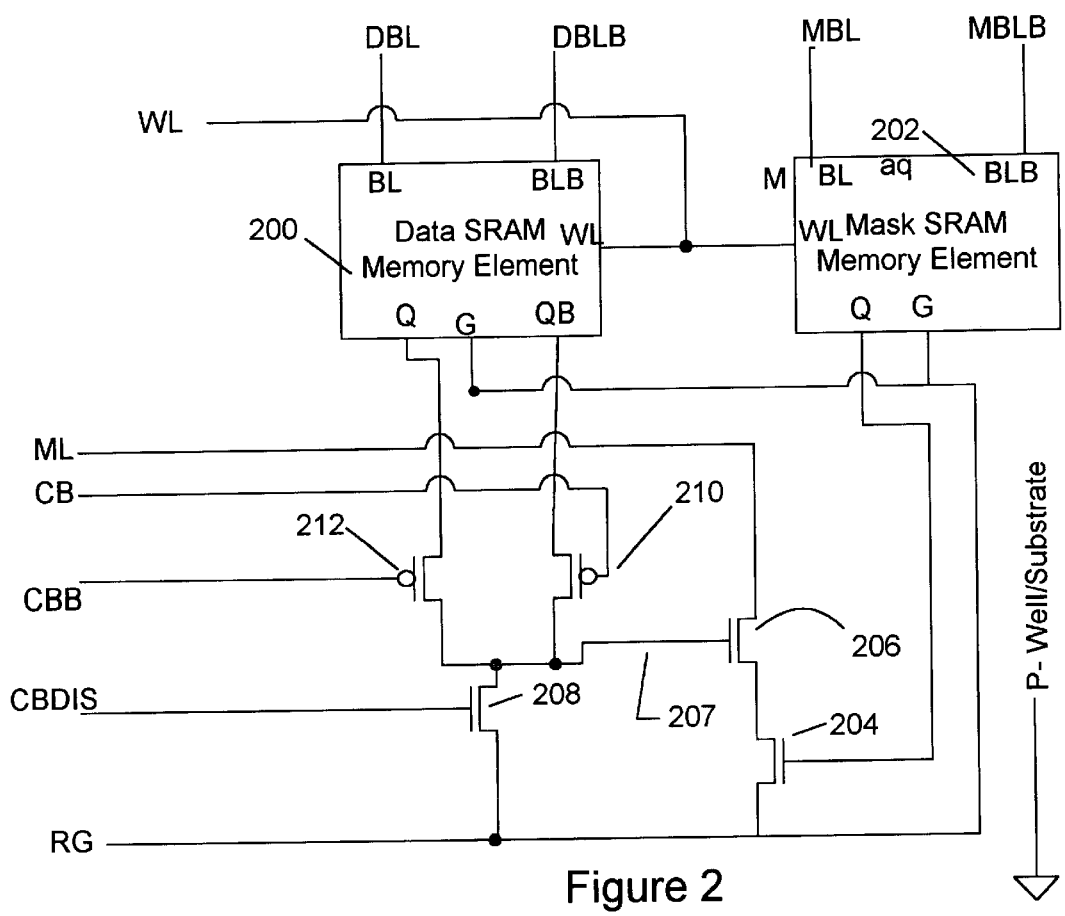
FIG. 2, a schematic diagram of a ternary CAM cell suitable for use with a parallel-pulldown match line.
Figure 3:
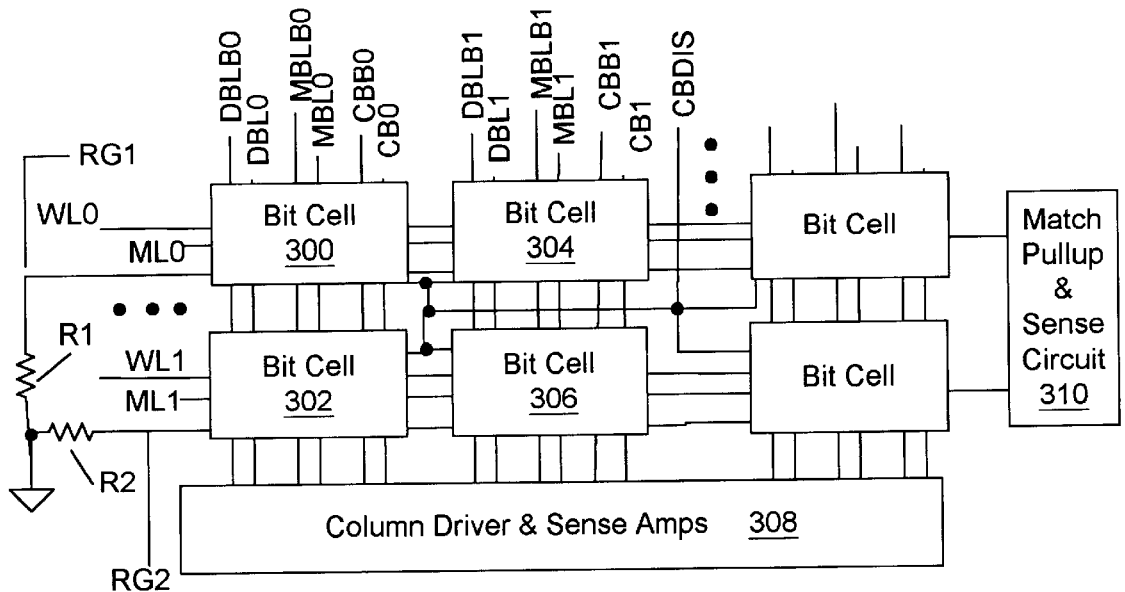
FIG. 3, a schematic diagram of an array of CAM cells having surge-current limiting devices according to the present invention.

The CAM cells of FIG. 2 are placed in an array, FIG. 3, having the CBDIS input of all cells, including all rows and columns, driven together. Write lines WL, and match lines ML of cells in the same row, are coupled into row write and row match lines, illustrated as WL0 and ML0 for the row having cells 300 and 304, or WL1 and ML1 for the row having cells 302 and 306. Write lines WL are driven by a row address decoder, not shown. Data DBL and data complement DBLB, mask MBL and mask complement MBLB, and compare data CB and complement CBB lines of cells of the same column, such as cells 300 and 302, are coupled into corresponding column lines, illustrated as DBLB0, DBL0, MBL0, MBLB0, CB0, and CBB0, and to a column driver and sense amplifier block 308. Similarly, CBB1 and CB1 are the compare data complement and compare data lines of the column containing bit cells 304 and 306. Row match lines, such as ML0 and ML1, are coupled to a match line pullup and sense circuit 310, and may be coupled to a priority encoder (not shown).

Row ground RG (FIG. 2) connections of each cell in each row are coupled together as a row ground line for the row, such as row ground lines RG1 and RG2 (FIG. 3). The row ground lines couple to the chip ground through resistive devices, such as resistive devices R1 or R2. While resistive devices R1 or R2 may be resistors, it is anticipated that they will more often be N-channel MOS transistors biased in the conductive region. These transistors may be biased on by coupling their gates to a power supply, or by coupling their gates to some other bias connection such that they operate as resistive devices or as current source devices.

Ternary data is written to a row of the array by placing data on the data DBL and data complement DBLB inputs of all cells, mask information on the mask MBL and mask complement inputs of all cells, and then pulsing the write line WL of the cells of a particular row, such as WL0, high. If a cell is to match only to a query of a one, the mask memory element 202 is written to a one and the data memory element 200 to a one. If a cell is to match only to a query of a zero, the mask memory element 202 is written to a one and the data memory element 200 to a zero. If a particular cell is to be ignored during query operations, the mask memory element 202 is written to a zero, in this event the data memory element 200 may be written to anything pleasing to the designer.

With reference to FIGS. 2, and 3 during a query operation, the match line pullup and sense circuit 310 initially precharges all match lines, such as match lines ML0 and ML1, high. During this time, the match detect circuit pre-discharge line CBDIS is held high to discharge all mismatch nodes 207 to ground, and all compare data and compare data complement lines of the array, such as CB0, CB1, CBB0, and CBB1 are held high and thus inactive. Before each query operation, this match line pullup and sense circuit 310 stops precharging the match lines, and the pre-discharge line CBDIS is turned off.

After pre-discharge line CBDIS is low, selected compare data and compare data complement lines, such as CB0 and CBB1, are pulled low. Note that only one compare data or compare data complement line in each column may be pulled down simultaneously, which is pulled down depends on compare data. Both the compare data and compare data complement lines of particular columns may be left high if that column is to be ignored in the comparison.

The fall of the selected compare data and compare data complement lines may cause a mismatch node of any or all cells to rise, in turn causing the match lines ML connected to those cells to discharge. Those match lines that discharge are recorded by the match pullup and sense circuit 310 and/or the priority encoder 312 as not matching, while those that remain high are recorded as matching the query.

As the query cycle ends, compare data and compare data complement lines, such as lines CB0, CB1, CBB0, and CBB1, are all driven high, this may be before or after the match lines are sensed since the match lines will hold information for a short time. After the compare data and compare data complement lines are all high, the match detect pre-discharge line CBDIS is driven high to discharge all mismatch nodes 207. Once the match lines are sensed, and all mismatch nodes 207 are discharged, the match pullup and sense circuit 310 drives all match lines, such as match lines ML0 and ML1, high to prepare for the next cycle.

Figure 4:
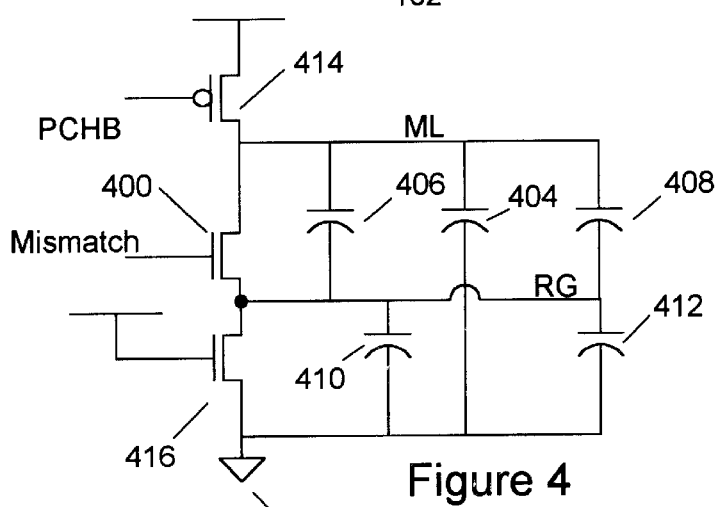
FIG. 4, a simplified schematic modeling an array section, illustrating how the surge-current limiting devices control surge currents.

An equivalent circuit to these cells in parallel pulldown match line ML (FIG. 4) configuration therefore has a pulldown device 400, driven by a Mismatch node of at least one cell. Pulldown device 400 may represent many parallel devices, and when active, couples the match line ML to row ground RG. Match line ML has some significant, distributed, capacitance to ground 402 and to the row ground RG, representing device junction capacitance 404, capacitance to adjacent interconnect 406, and other parasitic capacitances 408, including parasitic capacitances of inactive pulldown devices in other cells of the same match line ML. The row ground RG has additional parasitic capacitances to ground, or effectively to ground, representing junction capacitance of other devices 410 and other parasitic capacitance 412. There is also a resistive device 416, the resistive device shown is a small transistor biased ON by coupling its gate to a power supply rail.

In operation a precharge device 414 places a charge on the match line ML, charging the capacitances 404, 406, and 408. One or more cells of match lines of several rows then discharges, or charge shares, these capacitances to the row ground RG. The row ground line RG has sufficient capacitance that this discharge or charge share reduces the voltage of the match line ML to a sufficiently low value that match detect circuitry (not shown) sees a logic zero.

The row ground RG line then discharges through the resistive device 416 to ground 402. This discharge takes somewhat more time than was required for the match line ML to discharge or charge share with the row ground RG line. Since the charge is discharged more slowly from the row ground RG to chip ground 402, peak current injected to chip ground 402 is reduced. Further, peak current injected to chip ground 402 is no longer a significant function of the number of cells mismatching in each row.

Figure 5:
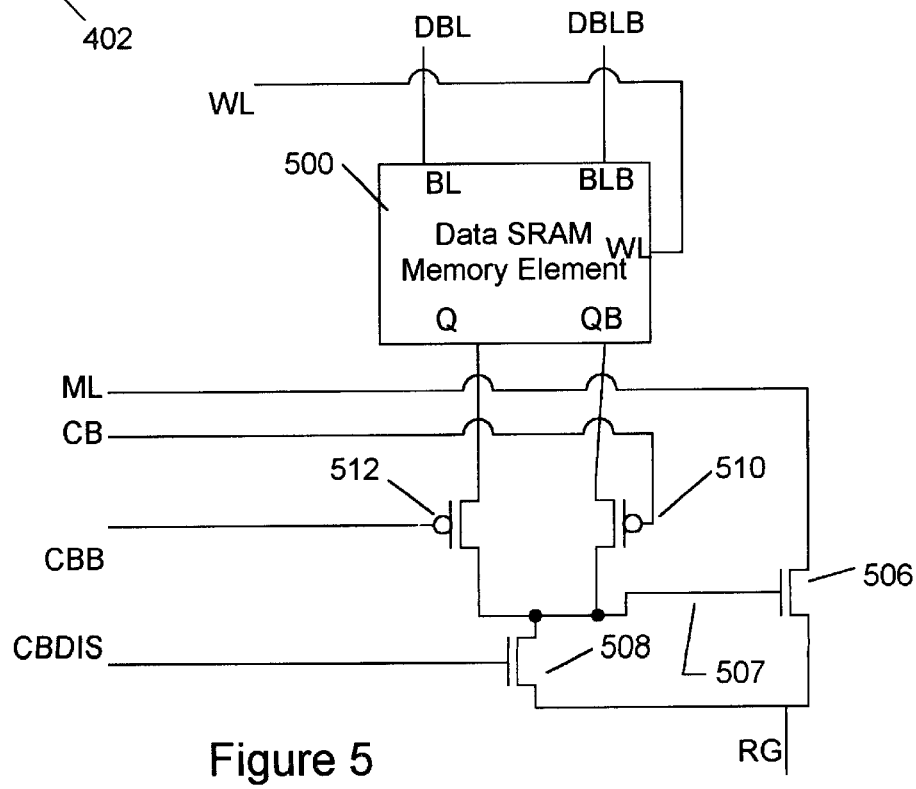
FIG. 5, a schematic diagram of a binary CAM cell for use with the surge-current limiting devices, showing substrate connections.

It is anticipated that the present invention is also operable with other CAM cell designs suitable for use with a parallel-pulldown match line, including binary cells. It is anticipated at a single match line may also connect to a combination of binary and ternary cells. A binary cell suitable for use with a resistive device coupling a row ground line to chip ground has a match line ML (FIG. 5) typically coupled to two or more cells. Each cell also has a static memory element 500 for storing a data bit; these memory elements are of the six transistor static type as illustrated in FIG. 1B. Alternatively, the cell may use memory elements of the four transistor plus two resistor "poly load" type known in the art. The cell also has compare circuitry for comparing the data bit against compare inputs and for driving the match line ML to a row ground line RG.

The compare circuitry includes a compare pulldown transistor 506 having source coupled to a row ground RG and drain coupled to the match line ML. The gate of compare pulldown transistor 506 is driven by a mismatch node 507. Mismatch node 507 has a pre-discharge transistor 508 controlled by pre-discharge cell input CBDIS and first 510 and second 512 compare transistors. First compare transistor 510 has a gate driven by true compare data input CB, and source driven by a complement data output of data bit memory element 500. Second compare transistor 512 has a gate driven by a complement compare data input CBB, and source driven by a true data output of data bit memory cell 500.

An alternative embodiment utilizes a row ground-return line that is common to two rows, but not to the entire array. This permits use of a common layout technique wherein alternate rows of memory cells are mirrored such that adjacent cells may share common power and ground lines and contacts, and minimize the need for well spacings in the array. In this embodiment, each ground return line has a resistive device to chip ground as discussed above.

Yet another alternative embodiment utilizes a complimentary design to that discussed above. In this embodiment, the N-type match line pulldown device is replaced by a P-type match line pullup device, and the compare circuitry is reconfigured as known in the art such that the P-type match line pullup device will drive the match line high only when a mismatch occurs. Similarly, match lines are precharged low, instead of high, between query cycles. Each match line pullup device is coupled to a row power return line, having a resistive device coupling the row power return line to a power rail. This embodiment operates virtually identically to the previously described embodiments, with all signals reversed. The term "match line pull device" shall include the match line pulldown device of the previously described embodiments, and the match line pullup device of this embodiment, the term "row return line" shall include the row ground return line of the previously described embodiments, and the row power return line of this embodiment, and the term "rail" shall include the chip ground of the previously described embodiments and the power rail of this embodiment.

While the invention has been particularly shown and described with reference to a preferred embodiment thereof, it will be understood by those skilled in the art that various other changes in the form and details may be made without departing from the spirit and scope of the invention. It is to be understood that various changes may be made in adapting the invention to different embodiments without departing from the broader inventive concepts disclosed herein and comprehended by the claims that follow.

What is claimed is:

1. A content addressable memory system comprising:
    an array of CAM cells having a plurality of CAM cells, a plurality of rows each having a match line, and a plurality of columns, such that each CAM cell is disposed within a row and a column, wherein each row contains a plurality of CAM cells associated therewith, wherein there are a plurality of row return lines, wherein each CAM cell has a match line pull device coupled to the match line of the row associated with each CAM cell, the match line pull devices also coupled to the row return lines;
    wherein each row return line is coupled through a resistive device to a rail; and
    wherein each CAM cell further comprises a data memory element and comparison logic for comparing query data against the data memory element, the comparison logic coupled to control the match line pull device.

2. The content addressable memory system of claim 1 wherein the match line pull devices are match line pulldown devices, wherein the row return lines are ground return lines, and wherein the rail is a chip ground.

3. The content addressable memory system of claim 1, wherein the match line pull devices are match line pullup devices, wherein the row return lines are power return lines, and wherein the rail is a power rail.

4. The content addressable memory system of claim 1, wherein a plurality of the CAM cells further comprises a mask memory element capable of storing two states, and wherein the match line pull device of each CAM cell is capable of driving the match line only if the mask memory element is in a particular state.

5. The content addressable memory system of claim 4, wherein the row return line is a row ground return line, and is coupled as the ground return connection of circuitry selected from the group consisting of the data memory element, the mask memory element, and the comparison circuitry.

6. The content addressable memory system of claim 4 wherein two rows of CAM cells are coupled to each row ground return line.

7. The content addressable memory system of claim 4 wherein the resistive devices are transistors biased into the conductive region.

8. The content addressable memory system of claim 7, wherein the resistive devices are transistors biased to serve as current sources.

9. A method of operating a content addressable memory system to control surge currents, the content addressable memory system comprising an array of CAM cells having rows and columns, a plurality of row return lines each coupled to cells of at least one row of CAM cells and coupled through at least one resistive device, a plurality of match lines each coupled to cells of a row of CAM cells, the method comprising the steps of:
    storing data to be compared against into the array of CAM cells;
    precharging the plurality of match lines;
    providing compare data to the array of CAM cells;
    sharing charge of match lines having a mismatch condition through match line pull devices of CAM cells with the row return lines;
    sensing state of the match lines; and
    discharging the row return lines through the resistive devices to a rail.

10. The method of claim 9, wherein the row return lines are row ground return lines, the match line pull devices are match line pulldown device, and wherein the rail is chip ground.

11. The method of claim 10, wherein at least some of the CAM cells are of the ternary type.

12. The method of claim 10, wherein two rows of CAM cells are coupled to each return line.

13. A row of content addressable memory comprising:
    a plurality of content addressable memory cells, where each cell comprises:
        a data memory element for storing data,
        a match line pull device, and
        comparison logic for comparing data memory element contents with query data and for controlling the match line pull device;
    a row match line;
    a row return line; and
    a resistive device for coupling the row return line to a rail.

14. The row of claim 13, wherein the row return line is a row ground return line, the match line pull device is a match line pulldown device, and the rail is chip ground.

15. The row of claim 13, wherein the row return line is a row power return line, the match line pull device is a match line pullup device, and the rail is a power rail.

16. The row of claim 13, wherein at least some of the cells are of the ternary type.

17. The row of claim 13, wherein the resistive device is a transistor biased into conduction.

* * * * *